United States Patent
Schmich

(10) Patent No.: US 6,396,709 B1
(45) Date of Patent: May 28, 2002

(54) PRINTED-CIRCUIT BOARD HAVING RIGID AND ELASTICALLY DEFORMABLE SECTIONS AND DEVICE HAVING SUCH A PRINTED-CIRCUIT BOARD

(75) Inventor: Franz Schmich, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/528,370

(22) Filed: Mar. 17, 2000

(30) Foreign Application Priority Data

Mar. 30, 1999 (DE) .......................................... 199 14 418

(51) Int. Cl.$^7$ ................................................ H05K 7/02
(52) U.S. Cl. ........................ 361/760; 361/749; 361/750; 361/803; 439/67; 439/77; 439/492; 439/495
(58) Field of Search ........................... 361/760; 439/67, 439/77, 452, 495

(56) References Cited

U.S. PATENT DOCUMENTS

| | | | | |
|---|---|---|---|---|
| 4,509,095 A | * | 4/1985 | Boros | 361/386 |
| 4,680,675 A | * | 7/1987 | Sato | 361/397 |
| 5,121,297 A | * | 6/1992 | Haas | 361/398 |
| 5,144,742 A | * | 9/1992 | Lucas et al. | 29/830 |
| 5,499,444 A | * | 3/1996 | Doane, Jr. et al. | 29/830 |
| 5,764,497 A | * | 6/1998 | Mizumo | 361/803 |
| 6,224,395 B1 | * | 5/2001 | Dahlen et al. | 439/67 |
| 6,233,153 B1 | * | 5/2001 | Baur et al. | 361/752 |

* cited by examiner

Primary Examiner—Jeffrey Gaffin
Assistant Examiner—Thanh S. Phan
(74) Attorney, Agent, or Firm—Kenyon & Kenyon

(57) ABSTRACT

To increase the elasticity of an elastically deformable middle section of a printed-circuit board having at least two rigid circuit board sections provided with electric and/or electronic components and interconnected by the middle section, the middle section being provided with printed circuit traces extending from the first rigid section to the second rigid section, at least one opening is made in the elastically deformable middle section, the region of the middle section surrounding the opening forming at least two bars extending in a direction from the first rigid section to the second rigid section and laterally bordering the at least one opening, the printed circuit traces being arranged on the bars. When, in an electric/electronic device, the first rigid section of the printed-circuit board is fixedly joined to a component part supported in a vibration-damped manner, and the second rigid section is fixedly joined to the device housing, then vibrations are prevented from being transmitted from the printed-circuit board to the component part.

8 Claims, 4 Drawing Sheets

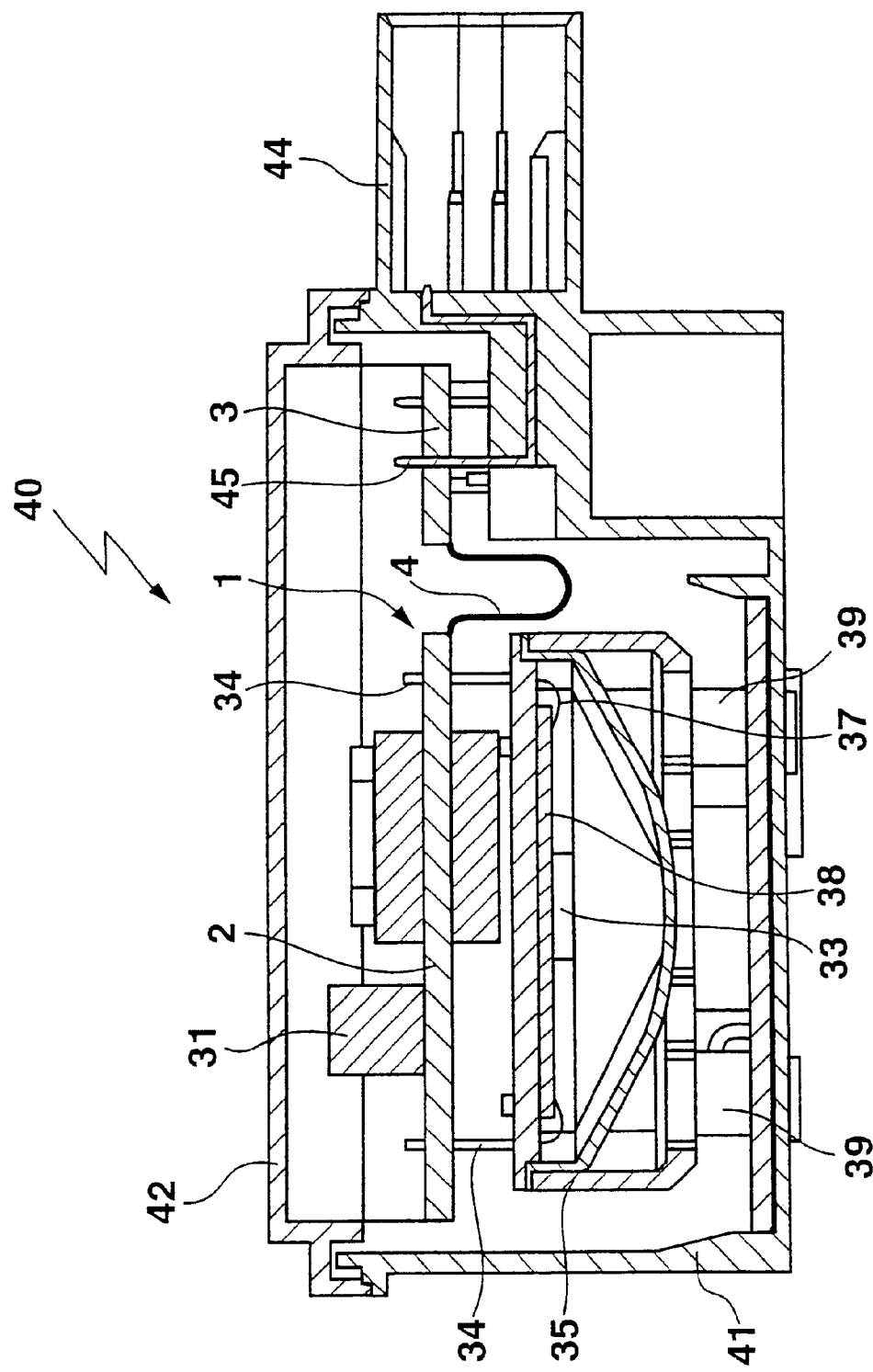

PRINTED-CIRCUIT BOARD HAVING RIGID AND ELASTICALLY DEFORMABLE SECTIONS AND DEVICE HAVING SUCH A PRINTED-CIRCUIT BOARD

BACKGROUND INFORMATION

In the literature, printed-circuit boards, referred to as flex-rigid printed-circuit boards, include two rigid end sections provided with electric and/or electronic components such as plated-through holes, printed circuit traces, and active or passive electronic component parts. The two rigid sections are interconnected by an elastically deformable middle section. Such printed-circuit boards can be bent about the middle section, and can consequently be mounted in electric devices in a very space saving manner. In particular, it is possible to connect a rigid end section of the printed-circuit board to an impact-and vibration-sensitive component part which is supported in a device housing in a vibration-damped manner and to connect the other rigid end section to a fixed housing part, for example, a plug part. The elastically deformable middle section prevents impact and vibration loads from being transmitted to the impact- and vibration-sensitive component part. However, it is a disadvantage that the middle section of the known flex-rigid printed-circuit boards, in spite of its elasticity, is still too stiff so that the known flex-rigid printed-circuit boards still partially transmit impact and shaking loads to the sensitive component parts.

SUMMARY OF THE INVENTION

The printed-circuit board according to the present invention obviates this disadvantage. This is achieved by at least one opening provided in the elastically deformable middle section of the conductor foil, the region of the middle section surrounding the opening forming at least two bars extending in a direction from the first rigid section to the second rigid section and laterally bordering the at least one opening, the printed circuit traces being arranged on the bars. By the openings in the middle section, the stiffness of the middle section is advantageously reduced and the elasticity is increased. The bars remaining in the middle section can have a very form design so that the stiffness of the conductor foil is significantly reduced at least in the region provided with the bars. In the borderline case, one single bar can be provided for each printed circuit trace, the width of the bar being only slightly greater than the width of the printed circuit trace. By these measures, it is achieved that shaking and vibration loads are not transmitted to the sensitive components parts, for example, sensor elements connected to the one rigid section, at all or only to an extremely small extent. The at least one opening in the middle section can advantageously be made by a simple punching operation. The printed-circuit board can be manufactured in a very inexpensive manner since greater changes to the manufacturing process are not required.

It is advantageous for the at least one opening to have the form of a slit, particularly the form of an oblong hole, extending in a direction from the first rigid section to the second rigid section.

The stiffness of the elastically deformable middle section can still be further reduced by providing a plurality of slit-type openings in the middle section, each opening being laterally bordered by two bars running parallel to each other. The bars can expediently be provided with printed circuit traces on the top side and bottom side.

In the housing of an electric/electronic device, it is particularly beneficial for the first rigid section of the printed-circuit board to be connected to an impact- and vibration-sensitive component part of the device which is supported in the device housing in a vibration-damped manner, and to fasten the second rigid section of the printed-circuit board to a fixed housing part, preferably a plug part mounted on the housing. Then, the distance between the first rigid section and the second rigid section of the printed-circuit board can be adjusted advantageously in that the bars connecting the two rigid sections bend in a loop-type manner. The loops effectively isolate the impact-sensitive component part from the housing part and effectively prevent impacts and vibrations from being transmitted to the sensitive component part, for example, a sensor, via the printed-circuit board.

BRIEF DESCRIPTION OF THE DRAWINGS

FIG. 5 shows a cross-section through an electric device containing the printed-circuit board according to the present invention.

DETAILED DESCRIPTION

Figure 1:
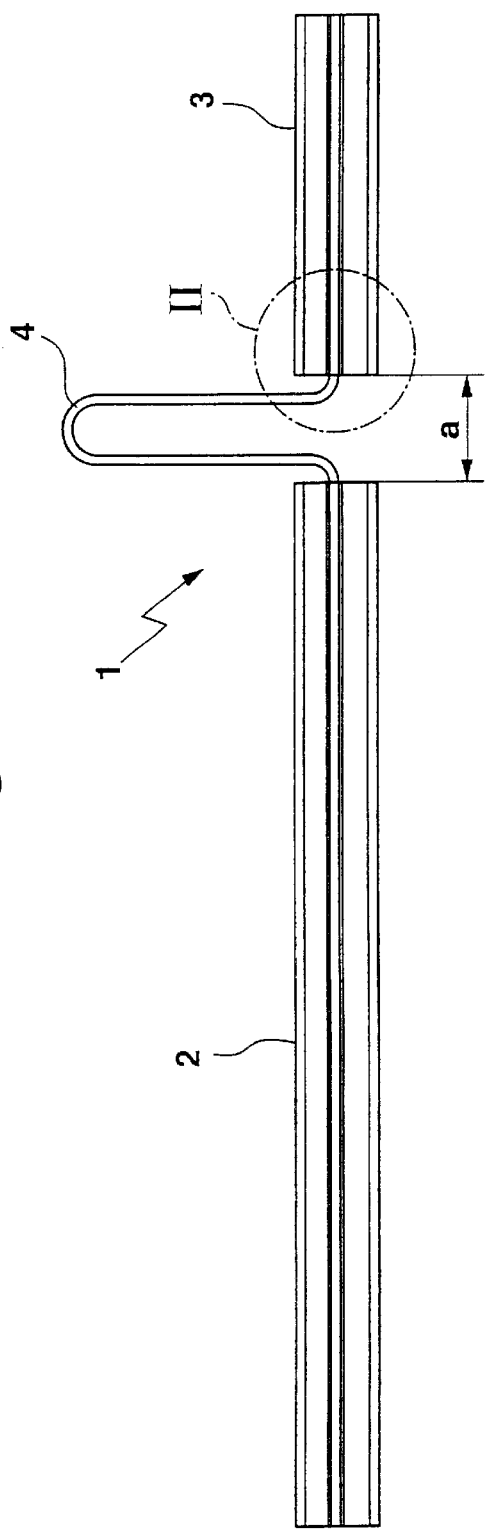
FIG. 1 shows a cross-section through a first exemplary embodiment of the conductor foil according to the present invention.
Figure 2:
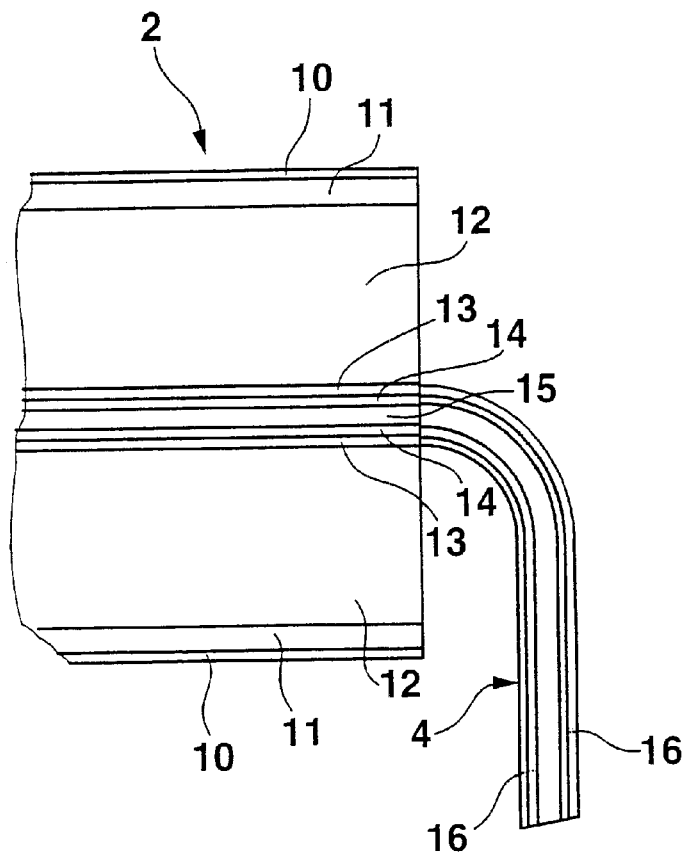
FIG. 2 shows an enlarged partial view of FIG. 1.

FIG. 1 shows a cross-section through a first exemplary embodiment of the printed-circuit board 1 according to the present invention. Printed-circuit board 1 has a first rigid section 2 and a second rigid section 3 which are interconnected by an elastically deformable middle section 4. As is discernible in FIG. 2, rigid sections 2,3 are composed of a polyimide film 15 with a copper foil 14 applied to both sides. An FR4 substrate 12, i.e., an epoxy resin substrate, is attached to both copper foils 14 via an insulation and/or adhesive layer 13, respectively. The relatively thick FR4 substrates give sections 2,3 of the printed-circuit board their stiffness. FR4 substrates 12 are in each case coated with a copper foil 11 and, subsequently, a covering foil 10. In FIG. 2, indiscernible printed circuit traces are formed in copper foils 11 and 14 in a known manner. Printed circuit traces of different layers can be interconnected via plated-through holes. As further shown in FIG. 2, elastically deformable middle section 4 of printed-circuit board 1 is formed by a parallel extension of polyimide film 15 laterally brought out of rigid section 2 or 3 together with copper foils 14 covering the polyimide film. Copper foils 14 of the middle section are covered with enamel or a polyimide overcoat 16.

Figure 4:
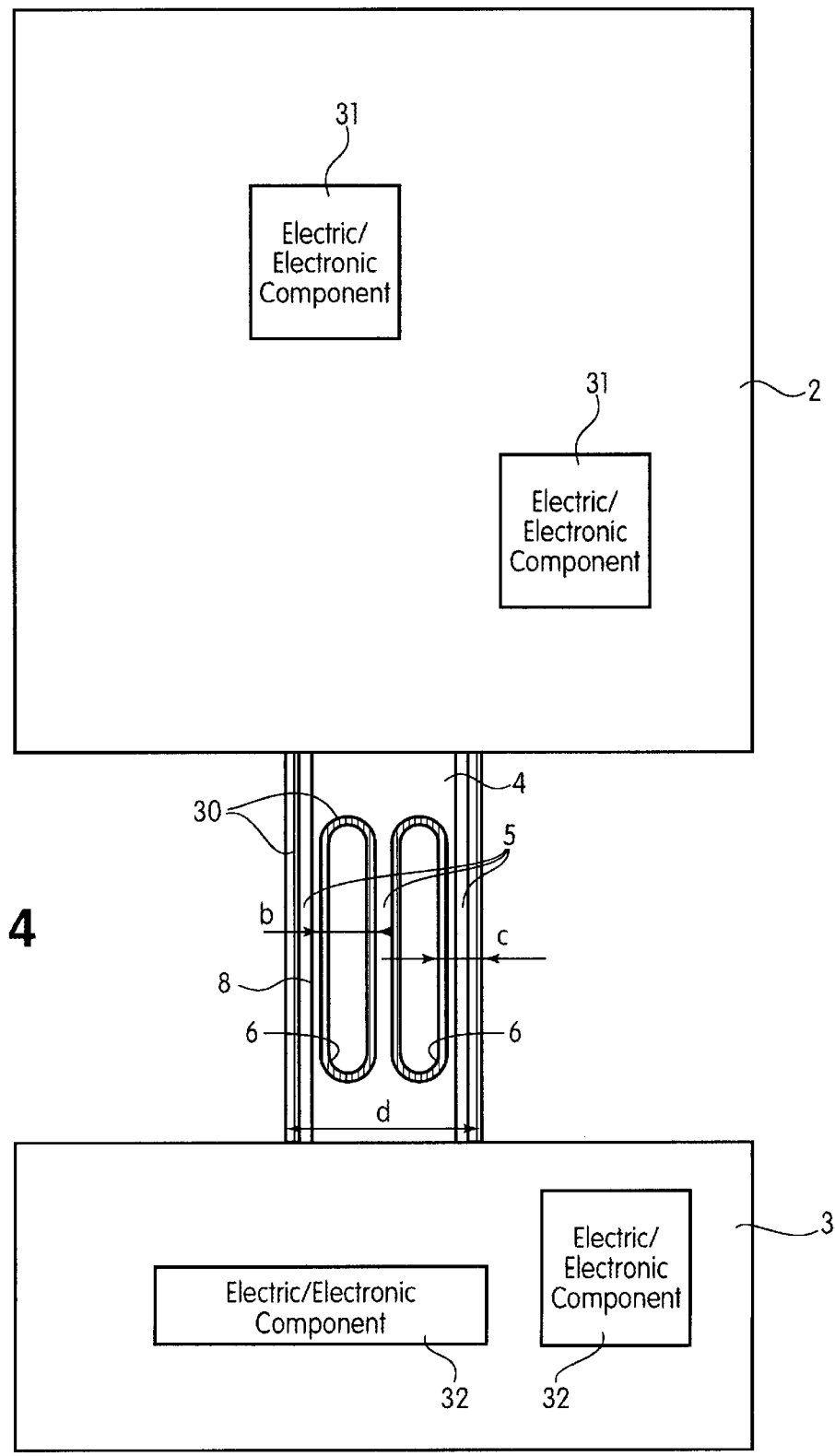
FIG. 4 shows a top view of the printed-circuit board from FIG. 1.

As is discernible in FIG. 4, middle section 4 has a smaller width d than rigid sections 2,3 and possesses material cutouts or openings 6 made in the middle section by punching. Openings 6 extend from the first rigid section 2 to the second rigid section 3 in a slit-shaped manner, being designed as oblong holes in this exemplary embodiment. Width b of openings 6 is, for example, 1.6 mm. Openings 6 are laterally bordered by bars 5 running parallel to each other. Bars 5 can have a very narrow form having widths c of, for example, 2 mm. Arranged on the bars are printed circuit traces of which only printed circuit trace 8 is depicted in FIG. 4. No printed circuit traces are provided in hatched edge areas 30 of middle section 4.

It is preferable for width c of bars 5 to be designed as narrow as possible to further reduce the stiffness of middle section 4. The extent to which this is possible depends on the number of printed circuit traces 8 running from first rigid section 2 to second rigid section 3. If necessary, width d of the middle section can be increased and additional bars 5 be provided. Subsequent to manufacturing the printed-circuit board, first rigid section 2 is equipped with electric and/or electronic components 31, and second rigid section 3 is equipped with components 32.

Figure 1A:
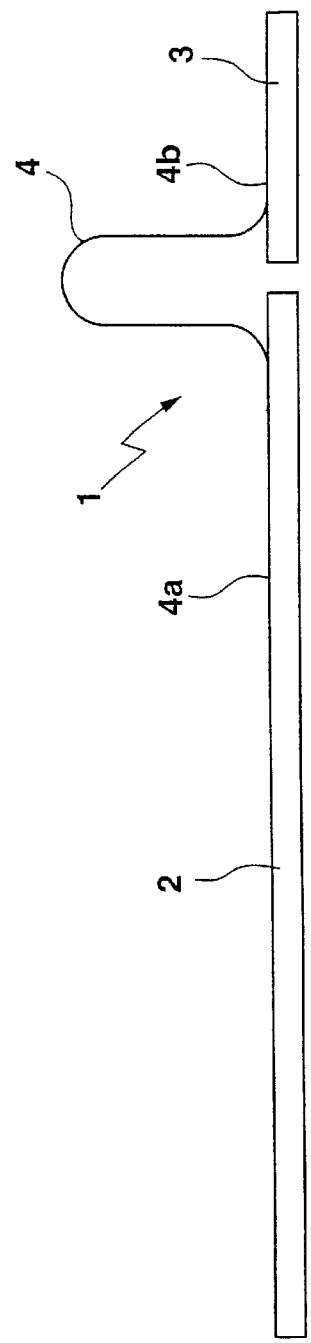
FIG. 1a shows a cross-section through a second exemplary embodiment of the conductor foil according to the present invention.
Figure 3:
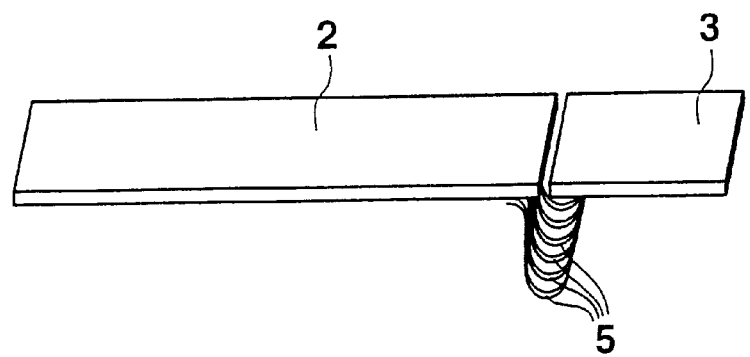
FIG. 3 shows a perspective view of FIG. 2.

FIGS. 1a and 3 show a further exemplary embodiment, where an elastically deformable conductor foil 4 is stuck on the top side of a first rigid FR4 substrate 2 with one end section 4a and on the top side of a second rigid FR4 substrate 3 with the second end section 4b. Conductor foil 4 is composed of a polyimide substrate provided with printed circuit traces made of copper, the printed circuit traces being insulated to the exterior, for example, by an insulating enamel. The middle region of conductor foil 4 which is not stuck on FR4 substrates 2,3 constitutes the elastically deformable middle section and is provided with numerous bars 5 running parallel to each other, as shown in FIG. 3, the bars being formed in conductor foil 4 by punching.

The printed circuit traces can be provided on the top side and bottom side of bars 5, as in the exemplary embodiments shown here, or only on one side. It is also conceivable for the middle section 4 to be formed of a multilayer substrate having a plurality of conductor layers arranged one over another, it being possible then for more than two printed circuit traces arranged one over another to be formed on one bar.

If, in the exemplary embodiments shown in FIG. 1 and FIG. 1a, the two rigid circuit board sections 2 and 3 are moved toward each other in one plane, then elastically deformable bars 5 of middle section 4 form C-shaped or U-shaped loops.

FIG. 5 shows an electric/electronic device 40 which can be mounted, for example, in the engine compartment of a motor vehicle. Device 40 includes a housing 41 which can be closed with a housing cover 42. A plug part 44 having plug pins 45 is provided in a housing wall. In the interior of the housing, an impact- and vibration-sensitive sensor element 33 is arranged in a sensor housing 35. Sensor element 33 is mounted on a printed-circuit board or a hybrid 38 which is connected to wiring posts 34 via bonding wires 37. The sensor housing is supported in device housing 41 in a vibration-damped manner via damping elements 39. A printed-circuit board 1 whose construction corresponds to that shown in FIGS. 1, 1a or 4, is arranged in the interior of device housing 41, the first rigid section 2 of printed-circuit board 1 being firmly connected to wiring posts 34 of sensor housing 35. Sensor element 33 is electrically connected to printed circuit traces of rigid section 2 via wiring posts 34. Further electric and/or electronic components 31 are likewise connected to first rigid section 2 of printed-circuit board 1. Components 31 are connected, via electric connections (not shown), to printed circuit traces of printed-circuit board 1 which, via bars 5 of elastically deformable middle section 4, are connected to printed circuit traces arranged on second rigid section 3. Second rigid section 3 is fixedly joined to housing 41.

As shown in FIG. 5, plug pins 45 of plug part 44 are passed through openings provided in second rigid section 3, and there soldered to the printed circuit traces of printed-circuit board 1. Distance a (FIG. 1) between the first and second rigid sections is selected such that bars 5 of middle section 4 form U-shaped loops. During vibrations loads of housing 41, the vibrations are then advantageously prevented from being transmitted to first rigid section 2 fixedly joined to sensor 33.

What is claimed is:

1. A printed-circuit board comprising:
    a first rigid circuit board section;
    a second rigid circuit board section;
    at least one of: (a) electric components, and (b) electronic components, situated on the first and second rigid circuit board sections;
    an elastically deformable middle section interconnecting the first and second rigid circuit board sections, the middle section including at least two bars extending in a direction from the first rigid circuit board section to the second rigid circuit board section, the at least two bars surrounding and laterally bordering at least one opening; and
    printed circuit traces situated on the at least two bars, the printed circuit traces extending from the first rigid circuit board section to the second rigid circuit board section;
    wherein the at least one opening in the middle section is an oblong hole.

2. The printed-circuit board according to claim 1, wherein the at least one opening includes a plurality of slit-type openings, each of the openings being laterally bordered by two bars of the at least two bars running parallel to each other.

3. The printed-circuit board according to claim 1, wherein the printed circuit traces are situated on a top side and on a bottom side of the at least two bars.

4. A device comprising:
    a housing having a fixed part;
    an impact-sensitive and vibration-sensitive component part supported in the housing in a vibration-damped manner; and
    a printed-circuit board including a first rigid section and a second rigid section, the first rigid section being fixedly joined to the component part, the second rigid section being fastened to the fixed housing part,
    wherein the printed-circuit board further includes:
        (a) an elastically deformable middle section interconnecting the first and second rigid circuit board sections, the middle section including at least two bars extending in a direction from the first rigid circuit board section to the second rigid circuit board section, the at least two bars surrounding and laterally bordering at least one opening, the at least one opening in the middle section being formed as an oblong hole; and
        (b) printed circuit traces situated on the at least two bars, the printed circuit traces extending from the first rigid circuit board section to the second rigid circuit board section.

5. The device according to claim 4, wherein the component part includes a sensor element.

6. The device according to claim 4, wherein the fixed housing part includes a plug part mounted on the housing.

7. The device according to claim 4, wherein a distance between the first and second rigid sections is smaller than a length of the bars.

8. The device according to claim 7, wherein the distance is adjusted such that the bars bend in a loop-type manner.

* * * * *

UNITED STATES PATENT AND TRADEMARK OFFICE
CERTIFICATE OF CORRECTION

PATENT NO. : 6,396,709 B1
DATED : May 28, 2002
INVENTOR(S) : Franz Schmich

It is certified that error appears in the above-identified patent and that said Letters Patent is hereby corrected as shown below:

<u>Title page,</u>
Item [57], ABSTRACT, change "To increase the" to -- The --.
Line 7, change "middle section, the middle section being provided" to middle section is increased. -- The middle section is provided --
Line 8, change "rigid section, at least one opening is made in the elastically deformable middle section, the region" to -- rigid section, and includes at least one opening. The region --
Line 11, change "opening forming at least" to -- opening forms at least --
Line 14, change "laterally bordering" to -- laterally borders --
Line 14, change "opening, the printed circuit" to -- opening. The printed circuit --
Line 15, change "being arranged" to -- are arranged --
Line 18, change "supported in a vibration-damped manner," to -- supported against vibration, --
Line 25, change "prevented from being transmitted" to -- not transmitted --

<u>Column 1,</u>
Line 23, change "it is a disadvantage...still partially transmit" to -- conventional middle sections remain too stiff, despite their elasticity, to prevent a partial transmission of --
Line 32, change "this disadvantage. This is achieved by" to -- the disadvantage of conventional middle sections of flex-rigid printed circuit boards by providing --
Line 33, delete "provided"
Line 34, change "conductor foil, the region" to -- conductor foil, in. which the region --
Line 35, change "opening forming" to -- opening forms --
Line 35, change "extending" to -- that extend --
Line 37, change "laterally bordering" to -- laterally border --
Line 37, change "opening, the printed" to -- opening. The printed --
Line 38, change "being" to -- are --
Line 38, change "By the" to -- The --
Line 39, change "middle section, the stiffness of the middle section is advantageously reduced and the elasticity is increased." to -- middle section advantageously reduce the stiffness and increase the elasticity of the middle section --
Line 41, change "have a very form design" to -- be designed to reduce --
Line 43, change "foil is significantly reduced at least" to -- foil at least --

UNITED STATES PATENT AND TRADEMARK OFFICE
CERTIFICATE OF CORRECTION

PATENT NO. : 6,396,709 B1
DATED : May 28, 2002
INVENTOR(S) : Franz Schmich

It is certified that error appears in the above-identified patent and that said Letters Patent is hereby corrected as shown below:

Column 1 cont'd,
Line 44, change "In the borderline case," to -- In one embodiment, --
Line 47, change "By these measures, it is achieved that shaking and vibration loads are not transmitted to the sensitive components parts" to -- Through these measures, shaking and vibration loads are not transmitted at all or only to an extremely small extent to the sensitive components parts --
Line 50, change "section, at all or only to an extremely small extent." to -- section. --
Line 54, change "greater" to -- Further --
Line 67, change "for" to -- to connect --

Column 2,
Line 1, change "to be connected to an" to -- to an --
Line 3, change "supported in the device housing in a vibration-damped-manner," to -- supported against vibration in the device housing, --
Line 5, change "part, preferably a plug part" to -- part, such as a plug part --
Line 6, change "Then, the" to -- The --
Line 8, change "can be" to -- can then be --
Line 8, change "advantageously in that" to -- by bending --
Line 9, delete "bend"
Line 38, change "FIG. 2, rigid sections" to -- FIG. 2, which is an enlarged view of the circled region identified by roman numeral II in FIG. 1, rigid sections --
Line 58, change "openings" to -- slit-shaped openings --
Line 59, change "section 3 in a slit-shaped manner, being designed" to -- section 3. --
Line 60, change "holes in this exemplary embodiment" to -- holes. --
Line 63, change "have a very narrow form" to -- be narrow --
Line 64, change "Arranged on the bars are printed" to -- Printed --
Line 65, change "circuit traces of" to -- circuit traces are arranged on the bars, of --

Column 3,
Line 1, change "It is preferable for width c of bars 5 to be designed as" to -- The width c of bars 5 can be --
Line 2, change "narrow as possible" to -- narrow --
Line 3, change "The extent to which this is possible depends" to -- The narrowness of the bars depends --
Line 6, change "bars 5 be" to -- bars 5 can be --
Line 7, change "Subsequent to manufacturing" to -- After assembly of --
Line 12, change "foil 4 is stuck on" to -- foil is attached to --

UNITED STATES PATENT AND TRADEMARK OFFICE
CERTIFICATE OF CORRECTION

PATENT NO. : 6,396,709 B1
DATED : May 28, 2002
INVENTOR(S) : Franz Schmich

It is certified that error appears in the above-identified patent and that said Letters Patent is hereby corrected as shown below:

Column 3 cont'd,
Line 15, change "Conductor foil 4 is" to -- The conductor foil is --
Line 19, change "of conductor foil 4" to -- of the conductor foil --
Line 20, change "stuck on" to -- attached to --
Line 23, change "formed in conductor foil 4" to -- formed in the conductor foil --
Line 29, change "it being possible then for" to -- allowing --
Line 47, change "supported in" to -- supported against vibration in --

Column 4,
Lines 2 and 3, change "then advantageously prevented from being" to -- not --

Signed and Sealed this

Twenty-third Day of March, 2004

JON W. DUDAS
*Acting Director of the United States Patent and Trademark Office*